(12) United States Patent
Ting et al.

(10) Patent No.: US 12,376,294 B2
(45) Date of Patent: Jul. 29, 2025

(54) ELECTROSTATIC DISCHARGE CIRCUIT

(71) Applicant: eMemory Technology Inc., Hsinchu (TW)

(72) Inventors: Yun-Jen Ting, Hsinchu (TW); Chih-Wei Lai, Hsinchu County (TW); Yi-Han Wu, Hsinchu County (TW); Kun-Hsin Lin, Hsinchu County (TW); Hsin-Kun Hsu, Hsinchu County (TW)

(73) Assignee: EMEMORY TECHNOLOGY INC., Hsinchu (TW)

( * ) Notice: Subject to any disclaimer, the term of this patent is extended or adjusted under 35 U.S.C. 154(b) by 196 days.

(21) Appl. No.: 18/195,039

(22) Filed: May 9, 2023

(65) Prior Publication Data

US 2024/0022068 A1  Jan. 18, 2024

Related U.S. Application Data

(60) Provisional application No. 63/388,258, filed on Jul. 12, 2022.

(51) Int. Cl.
| | |
|---|---|
| *H10B 20/25* | (2023.01) |
| *G11C 16/24* | (2006.01) |
| *G11C 16/26* | (2006.01) |
| *G11C 17/16* | (2006.01) |
| *H01L 23/00* | (2006.01) |
| *H02H 9/02* | (2006.01) |

(52) U.S. Cl.
CPC ............ *H10B 20/25* (2023.02); *G11C 16/24* (2013.01); *G11C 16/26* (2013.01); *G11C 17/16* (2013.01); *H01L 23/576* (2013.01); *H02H 9/02* (2013.01)

(58) Field of Classification Search
CPC ........ H10B 20/25; G11C 16/24; G11C 16/26; G11C 17/16; G11C 16/10; H01L 23/576; H01L 27/0266; H01L 27/0255; H02H 9/02; H02H 9/046

See application file for complete search history.

(56) References Cited

U.S. PATENT DOCUMENTS

| | | | | |
|---|---|---|---|---|
| 6,388,850 B1 * | 5/2002 | Ker | ..................... | H02H 9/046 |
| | | | | 361/56 |
| 6,576,958 B2 * | 6/2003 | Ker | ..................... | H01L 27/0292 |
| | | | | 257/355 |
| 6,954,098 B2 * | 10/2005 | Hsu | ..................... | H03K 5/08 |
| | | | | 361/56 |

(Continued)

*Primary Examiner* — Thienvu V Tran
*Assistant Examiner* — Muaamar Qahtan Al-Taweel
(74) *Attorney, Agent, or Firm* — WPAT, PC (57) ABSTRACT

An ESD circuit includes a first P-type transistor, a second P-type transistor, a third P-type transistor, a first ESD current path, a second ESD current path, a biasing circuit and a control circuit. The control circuit is connected between the pad and a first node. The first P-type transistor is connected with the pad, the control circuit and a second node. The first ESD current path is connected between the second node and the first node. The second ESD current path is connected between the second node and the first node. The second P-type transistor is connected with the pad, the control circuit and a third node. The biasing circuit is connected between the third node and the first node. The third P-type transistor is connected with the pad, the third node, and a fourth node. The internal circuit is connected between the fourth node and the first node.

13 Claims, 7 Drawing Sheets

(56) References Cited

U.S. PATENT DOCUMENTS

| | | | | |
|---|---|---|---|---|
| 7,079,369 B2* | 7/2006 | Hulfachor | ............ | H10D 89/811 |
| | | | | 361/111 |
| 7,660,087 B2* | 2/2010 | Huang | .................. | H02H 9/046 |
| | | | | 361/56 |
| 8,179,647 B2* | 5/2012 | Chu | ....................... | H02H 9/046 |
| | | | | 361/118 |
| 11,508,719 B2* | 11/2022 | Ting | ....................... | G11C 5/145 |
| 2007/0183104 A1* | 8/2007 | Tseng | .................. | H10D 89/819 |
| | | | | 361/56 |
| 2015/0214732 A1* | 7/2015 | Haruki | .................. | H02H 9/042 |
| | | | | 361/56 |
| 2017/0338219 A1* | 11/2017 | Choi | ....................... | H10D 8/00 |

* cited by examiner

ELECTROSTATIC DISCHARGE CIRCUIT

This application claims the benefit of U.S. provisional patent application No. 63/388,258, filed Jul. 12, 2022, the subject matter of which is incorporated herein by reference.

FIELD OF THE INVENTION

The present invention relates to a circuit, and more particularly to an electrostatic discharge (ESD) circuit.

BACKGROUND OF THE INVENTION

For increasing the operating speed and integration level of integrated circuits (ICs), the size of semiconductor devices in a CMOS IC is gradually decreased, and the gate oxide layer of the semiconductor device becomes thinner and thinner. Consequently, the breakdown voltage of the gate oxide layer is reduced, and the breakdown voltage at the PN junction of the semiconductor device is also reduced.

As known, an ESD zapping effect may lead to damage of the integrated circuit. For avoiding the ESD zapping effect, the integrated circuit is usually equipped with an ESD circuit. The ESD circuit provides an ESD current path. Since the ESD current flows through the ESD current path, the internal circuit of the integrated circuit is not damaged by the ESD current.

SUMMARY OF THE INVENTION

An embodiment of the present invention provides an electrostatic discharge (ESD) circuit connected with a pad and an internal circuit. The ESD circuit comprises: a control circuit, a first P-type transistor, a first ESD current path, a second ESD current path, a second P-type transistor and a biasing circuit. The control circuit is connected between the pad and a first node. A first source/drain terminal of the first P-type transistor is connected with the pad, a gate terminal of the first P-type transistor is connected with the control circuit, and a second source/drain terminal of the first P-type transistor is connected with a second node. The first ESD current path is connected between the second node and the first node. The second ESD current path is connected between the second node and the first node. A first source/drain terminal of the second P-type transistor is connected with the pad, a gate terminal of the second P-type transistor is connected with the control circuit, and a second source/drain terminal of the second P-type transistor is connected with a third node. The biasing circuit is connected between the third node and the first node. A first source/drain terminal of the third P-type transistor is connected with the pad, a gate terminal of the third P-type transistor is connected with the third node, and a second source/drain terminal of the third P-type transistor is connected with a fourth node. The internal circuit is connected between the fourth node and the first node.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

Figure 1:
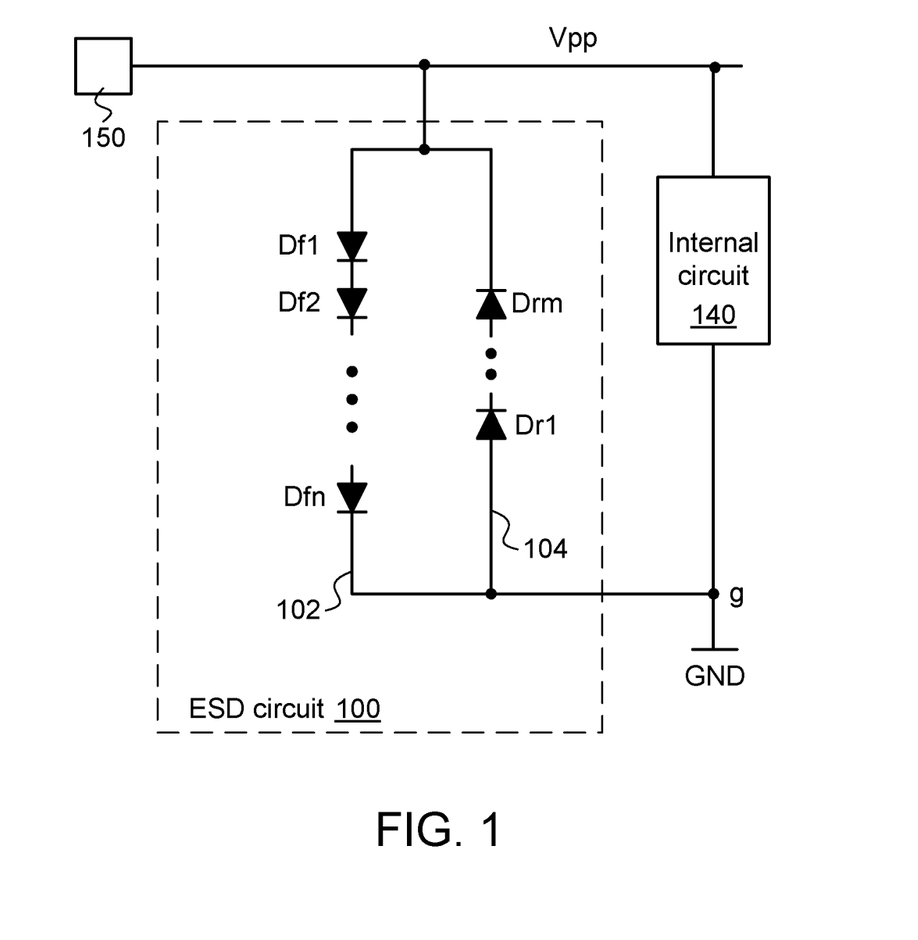
FIG. 1 is a schematic circuit diagram illustrating an ESD circuit according to a first embodiment of the present invention.

FIG. 1 is a schematic circuit diagram illustrating an ESD circuit according to a first embodiment of the present invention. The ESD circuit 100 and an internal circuit 140 are connected between a pad 150 which is at a first supply voltage Vpp and a second supply voltage GND. The first supply voltage Vpp is for programming a memory cell, and the first supply voltage Vpp is transmitted from the pad 150 to the ESD circuit 100 and the internal circuit 140, and the internal circuit 140 may comprise the memory cell. The second supply voltage GND is transmitted to the ESD circuit 100 and the internal circuit 140 through a node g.

The ESD circuit 100 comprises a first ESD current path 102 and a second ESD current path 104. The first ESD current path 102 comprises n diodes Df1~Dfn. The n diodes Df1~Dfn are connected between the first supply voltage Vpp and the second supply voltage GND in series. The second ESD current path 104 comprises m diodes Dr1~Drm. The m diodes Dr1~Drm are connected between the first supply voltage Vpp and the second supply voltage GND in series. In an embodiment, the second supply voltage GND is 0V.

The turn-on threshold voltage of the first ESD current path 102 can be expressed as n×Von, wherein Von is a cut-in voltage of each diode Df1~Dfn. For example, the cut-in voltage Von is 0.6V. If the voltage difference (Vpp−0V) between the first supply voltage Vpp and the second supply voltage GND is higher than n×Von, the first ESD current path 102 is turned on.

As mentioned above, the turn-on threshold voltage of the first ESD current path 102 (n×Von) must be set higher than a nominal voltage of the first supply voltage Vpp (for example, 5V). If the turn-on threshold voltage of the first ESD current path 102 (n×Von) is set lower than the nominal voltage of the first supply voltage Vpp, the first ESD current path 102 will be mis-triggered. Similarly, the turn-on threshold voltage of the first ESD current path 102 (n×Von) must be set lower than a breakdown voltage of the second ESD current path 104 which can be expressed as m×Vbj, wherein Vbj is a junction breakdown voltage of the diode. If the turn-on threshold voltage of the first ESD current path 102 n×Von is set higher than the breakdown voltage of the second ESD current path 104 (m×Vbj), the second ESD current path 104 will be mis-triggered. For example, when a positive electrostatic voltage is received by the pad 150, the first ESD current path 102 is immediately turned on to prevent the diode breakdown of the second ESD current path 104.

Similarly, the turn-on threshold voltage of the second ESD current path 104 can be expressed as m×Von. If the voltage difference (0V−Vpp) between the second supply voltage GND and the first supply voltage Vpp is higher than m×Von, the second ESD current path 104 is turned on.

For example, the cut-in voltage Von of the diode is 0.6V, the breakdown voltage Vbj of the diode is 4V, and the operating voltage of the internal circuit 140 is in the range between 0V and 6V. That is, the first ESD current path 102 needs to comprise at least 11 serially-connected diodes (11×0.6V=6.6V), and the second ESD current path 104 needs to comprise at least 2 serially-connected diodes (2×4V=8V). Consequently, the first ESD current path 102 or the second ESD current path 104 will not be mis-triggered.

Due to the process variation, the cut-in voltage Von of the diode is possibly subjected to a change. For avoiding the change of the cut-in voltage Von of the diode, an additional diode is added to the first ESD current path 102. Consequently, in the normal working state of the ESD circuit 100, the first ESD current path 102 will not be mis-triggered.

If a positive ESD zap is received by the pad 150, the first ESD current path 102 is turned on. Meanwhile, the ESD current flows from the pad 150 to the node g through the first ESD current path 102. If a negative ESD zap is received by the pad 150, the second ESD current path 104 is turned on. Meanwhile, the ESD current flows from the node g to the pad 150 through the second ESD current path 104.

Figure 2A:
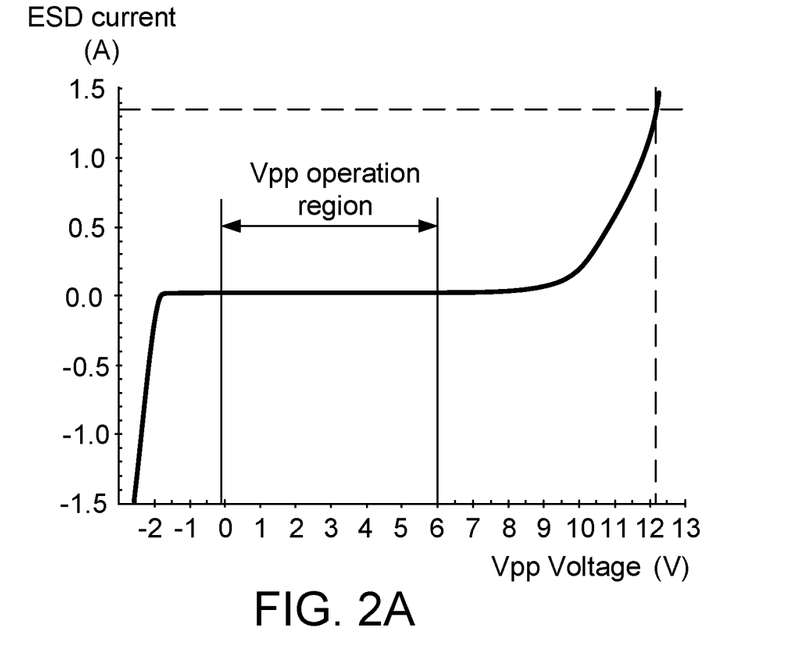
FIG. 2A is a plot illustrating the relationship between the voltage and the current of the ESD circuit according to the first embodiment of the present invention.

FIG. 2A is a plot illustrating the relationship between the voltage and the current of the ESD circuit according to the first embodiment of the present invention. In this embodiment, the first ESD current path 102 comprises 11 serially-connected diodes (i.e., n=11), and the second ESD current path 104 comprises 2 serially-connected diodes (i.e., m=2). Moreover, the operation region of the first supply voltage Vpp is 0V~6V. If the first supply voltage Vpp received by the internal circuit 140 is in the range between 0V and 6V, the ESD circuit 100 cannot be triggered and the internal circuit 140 may work normally.

If the first supply voltage Vpp is higher than 6V or the first supply voltage Vpp is lower than 0V, the ESD zapping effect possibly occurs. Consequently, the ESD circuit 100 is operated according to the change of the first supply voltage Vpp.

Figure 2B:
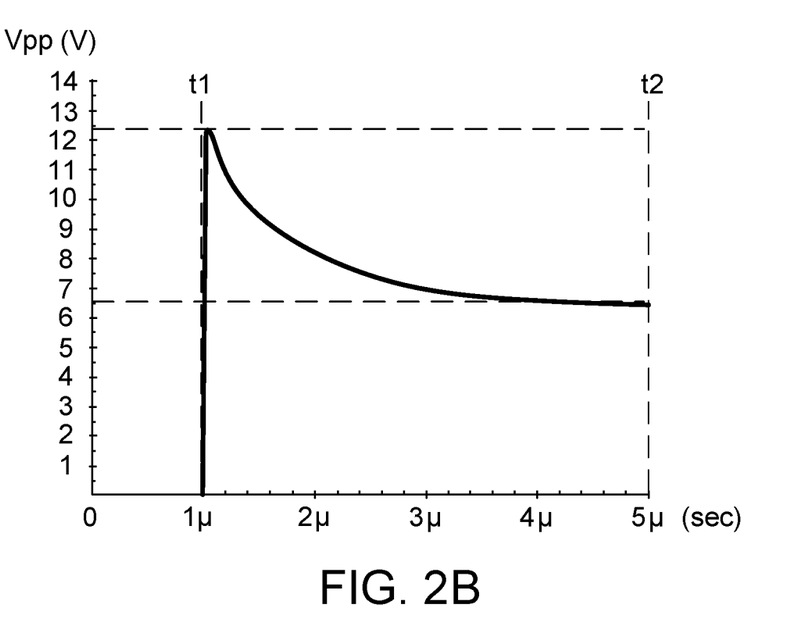
FIG. 2B is a plot illustrating the relationship between the voltage and the zapping time of the ESD circuit according to the first embodiment of the present invention when the HBM test is performed.

FIG. 2B is a plot illustrating the relationship between the voltage and the zapping time of the ESD circuit according to the first embodiment of the present invention when the HBM test is performed. Take a human body mode (HBM) test for example. When an electrostatic voltage of 2 KV is applied to the pad 150, the first supply voltage Vpp is increased to 12.5V and the ESD current is increased to 1.33 A. Consequently, the first ESD current path 102 is turned on, and the ESD current is transferred to the node g through the first ESD current path 102.

Please refer to FIG. 2B again. At the time point t1, the electrostatic voltage of 2 KV is received by the pad 150. The first supply voltage Vpp is increased to 12.5V in a very short time. Consequently, the first ESD current path 102 is turned on. Moreover, as shown in FIG. 2A, the ESD current is 1.33 A at the time point t1.

Since the first ESD current path 102 is turned on, the first supply voltage Vpp is decreased to 6.5V at the time point t2. That is, the first supply voltage Vpp is decreased to 6.5V within 41.1 s by the ESD circuit 100. Consequently, the semiconductor device in the internal circuit is protected from damage.

Moreover, the ESD current possibly flows through the ESD current path 102 or the second ESD current path 104. For preventing the ESD current to burn out the diodes Df1~Dfn and Dr1~Drm, the sizes of the diodes Df1~Dfn and Dr1~Drm should be large enough. However, due to the large sizes of the diodes Df1~Dfn and Dr1~Drm, the parasitic resistance is small. Consequently, the standby leakage of the ESD current is increased. The standby leakage may be decreased by increasing the numbers n and m of the serially-connected diodes of the two ESD current path 102 and 104. However, it should be carefully considered whether the increased turn-on threshold voltages of n×Von and m×Vbj fall within the criteria described above or not.

As shown in FIG. 2B, the first supply voltage Vpp is decreased to a voltage level lower than 6.5V after the ESD zapping effect is eliminated. However, since the first supply voltage Vpp is maintained at a level near 6.5V for a certain time period, the semiconductor device in the internal circuit 140 is still influenced by the voltage stress of 6.5V. Consequently, the characteristics of the semiconductor device are deteriorated, and the useful life of the semiconductor device will be reduced.

Figure 3:
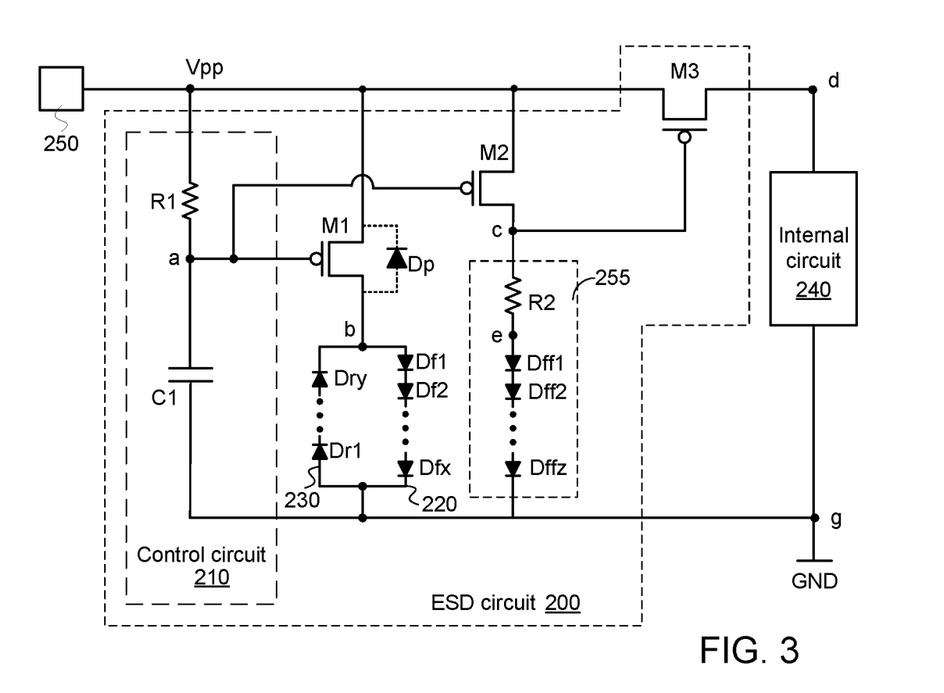
FIG. 3 is a schematic circuit diagram illustrating an ESD circuit according to a second embodiment of the present invention.

FIG. 3 is a schematic circuit diagram illustrating an ESD circuit according to a second embodiment of the present invention. A pad 250 receives the first supply voltage Vpp, and a node g receives the second supply voltage GND.

The ESD circuit 200 comprises a control circuit 210, a first ESD current path 220, a second ESD current path 230, a first P-type transistor M1, a second P-type transistor M2, a third P-type transistor M3 and a biasing circuit 255.

The control circuit 210 comprises a first resistor R1 and a first capacitor C1. A first terminal of the first resistor R1 is connected with the pad 250 to receive the first supply voltage Vpp. A second terminal of the first resistor R1 is connected with a node a. A first terminal of the first capacitor C1 is connected with the node a. A second terminal of the first capacitor C1 is connected to the node g to receive the second supply voltage GND. For example, a time constant τ consisting of the first resistor R1 and the first capacitor C1 (R1×C1) is between 1 μs~2.5 μs.

A first source/drain terminal of the first P-type transistor M1 is connected with the pad 250 to receive the first supply voltage Vpp. A gate terminal of the first P-type transistor M1 is connected with the node a in the control circuit 210. A second source/drain terminal of the first P-type transistor M1 is connected with the node b. Furthermore, the first P-type transistor M1 includes a parasitic diode Dp. An anode terminal of the parasitic diode Dp is connected with the second source/drain terminal of the first P-type transistor M1, and a cathode terminal of the parasitic diode Dp is connected with the first source/drain terminal of the first P-type transistor M1.

A first ESD current path 220 comprises x diodes Df1~Dfx. The x diodes Df1~Dfx are connected between the node b and the node g in series. An anode terminal of the first diode Df1 of the x diodes Df1~Dfx in the first ESD current path 220 is connected with the node b. A cathode terminal of the last diode Dfx of the x diodes Df1~Dfx in the first ESD current path 220 is connected with the node g. The anode terminal of any of the other diodes in the first ESD current path 220 is connected with the cathode terminal of the previous diode, and the cathode of any of the other diodes in the first ESD current path 220 is connected with the anode terminal of the next diode.

Moreover, a second ESD current path 230 comprises y diodes Dr1~Dry. The y diodes Dr1~Dry are connected between the node b and the node g in series. An anode terminal of the first diode Dr1 of the y diodes Dr1~Dry in the second ESD current path 230 is connected with the node g. A cathode terminal of the last diode Dry of the y diodes Dr1~Dry in the second ESD current path 230 is connected with the node b. The anode terminal of any of the other diodes in the second ESD current path 230 is connected with the cathode terminal of the previous diode, and the cathode of any of the other diodes in the second ESD current path 230 is connected with the anode terminal of the next diode.

A first source/drain terminal of the second P-type transistor M2 is connected with the pad 250 to receive the first supply voltage Vpp. A gate terminal of the second P-type transistor M2 is connected with the node a in the control circuit 210. A second source/drain terminal of the second P-type transistor M2 is connected with a node c. The biasing circuit 255 is connected between the node c and the node g.

The biasing circuit 255 comprises z diodes Dff1~Dffz and a second resistor R2. A first terminal of the second resistor R2 is connected with the node c. A second terminal of the second resistor R2 is connected with a node e. The z diodes Dff1~Dffz are connected between the node e and the node g. An anode terminal of the first diode Dff1 of the z diodes Dff1~Dffz in the biasing circuit 255 is connected with the node e. A cathode terminal of the last diode Dffz of the z diodes Dff1~Dffz in the biasing circuit 255 is connected with the node g. The anode terminal of any of the other diodes in the biasing circuit 255 is connected with the cathode terminal of the previous diode, and the cathode of any of the other diodes in the biasing circuit 255 is connected with the anode terminal of the next diode. According the second embodiment of the present invention, x, y and z are integers, and x is greater than y. In some embodiments, a resistance of the first resistor R1 is larger than a resistance of the second resistor R2.

A first source/drain terminal of the third P-type transistor M3 is connected with the pad 250 to receive the first supply voltage Vpp. A gate terminal of the third P-type transistor M3 is connected with the node c. A second source/drain terminal of the third P-type transistor M3 is connected with a node d. An internal circuit 240 is connected between the node d and the node g.

In the second embodiment, a positive ESD current path is defined by the first source/drain terminal of the first P-type transistor M1, a channel region of the first P-type transistor M1, the second source/drain terminal of the first P-type transistor M1, and the first ESD current path 220. The on/off states of the positive ESD current path is controlled by the control circuit 210.

Moreover, a negative ESD current path is defined by the second ESD current path 230, the second source/drain terminal of the first P-type transistor M1, the parasitic diode Dp of the first P-type transistor M1, and the first source/drain terminal of the first P-type transistor M1.

In the following descriptions, the x, y and z are set to 4, 1 and 4 respectively. That is, the first ESD current path 220 includes four diodes Df1~Df4, the second ESD current path 230 includes one diode Dr1, and the biasing circuit 255 includes four diodes Dff1~Dff4. Of course, the invention is not limited to this. A person skilled in the art may determine the number of x, y and z according to the actual requirements.

When power is supplied to the internal circuit 240, the first supply voltage Vpp starts to rise and the first capacitor C1 in the control circuit 210 starts to charge. Because the time constant T of the control circuit 210 is designed between 1 μs~2.5 μs, the node a will maintain at a lower voltage level for a short time period. The short time period is approximately less than 25 μs. During this short time period, the first P-type transistor M1 and the second P-type transistor M2 are turned on and the third P-type transistor M3 is turned off. In other words, the first P-type transistor M1 and the first ESD current path 220 are capable of conducting a current from the pad 250 to the node g in the short time period after the power is supplied.

After the short time period, the first capacitor C1 in the control circuit 210 is charged to a higher voltage level. As a result, the first P-type transistor M1 and the second P-type transistor M2 are turned off and the third P-type transistor M3 is turned on. The ESD circuit 200 enters the normal working state.

Figure 4A:
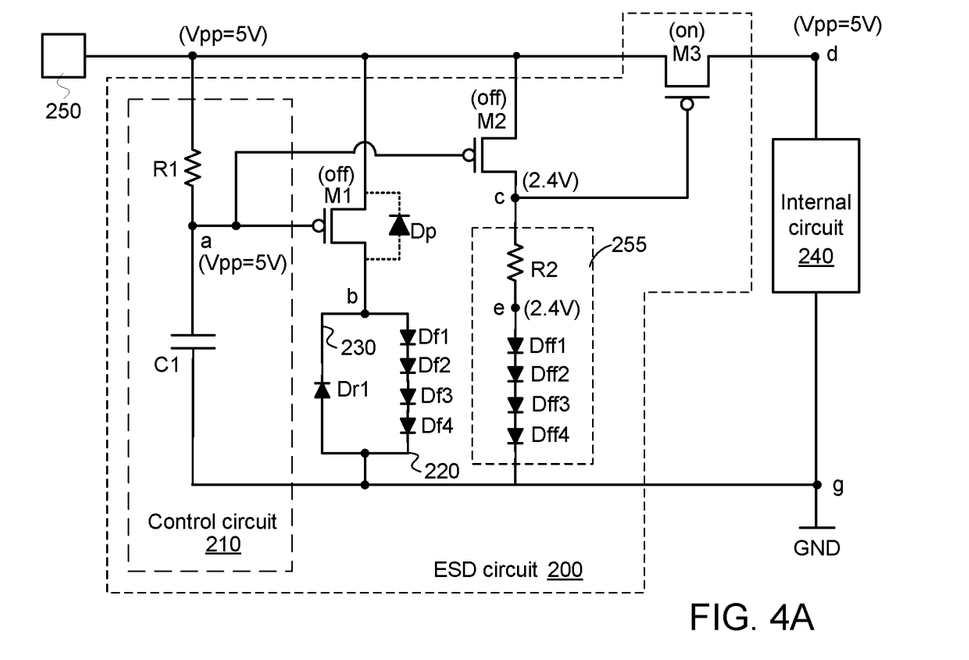
FIG. 4A is a schematic circuit diagram illustrating the ESD circuit of the second embodiment when the internal circuit is powered and the ESD zapping effect does not occur.

FIG. 4A is a schematic circuit diagram illustrating the ESD circuit of the second embodiment after the internal circuit is powered and the ESD zapping effect does not occur. In the normal working state, the pad 250 receives the first supply voltage Vpp and node g receives the second supply voltage GND. For example, the first supply voltage Vpp is 5V, and the second supply voltage GND is 0V.

In the normal working state, the first capacitor C1 of the control circuit 210 is charged to pull up the voltage at the node a to the first supply voltage Vpp (5V). As a result, the first P-type transistor M1 and the second P-type transistor M2 are turned off. Furthermore, the four diodes Dff1~Dff4 of the biasing circuit 255 may provide a bias voltage about 2.4V (4×Von=4×0.6) to the node c. Because the bias voltage is lower than the first supply voltage Vpp (5V), the third P-type transistor M3 is turned on. Under this circumstance, the first supply voltage Vpp (5V) received by the pad 250 is transmitted to the node d through the third P-type transistor M3, allowing the internal circuit 240 to operate normally.

To ensure that the third P-type transistor M3 is operated within the safe operation area (SOA) criteria in the normal working state, the number of diodes (integer z) in biasing circuit 255 can be further selected to set the biasing voltage at the node c based on the first supply voltage Vpp and the withstand voltage range of the third P-type transistor M3.

Figure 4B:
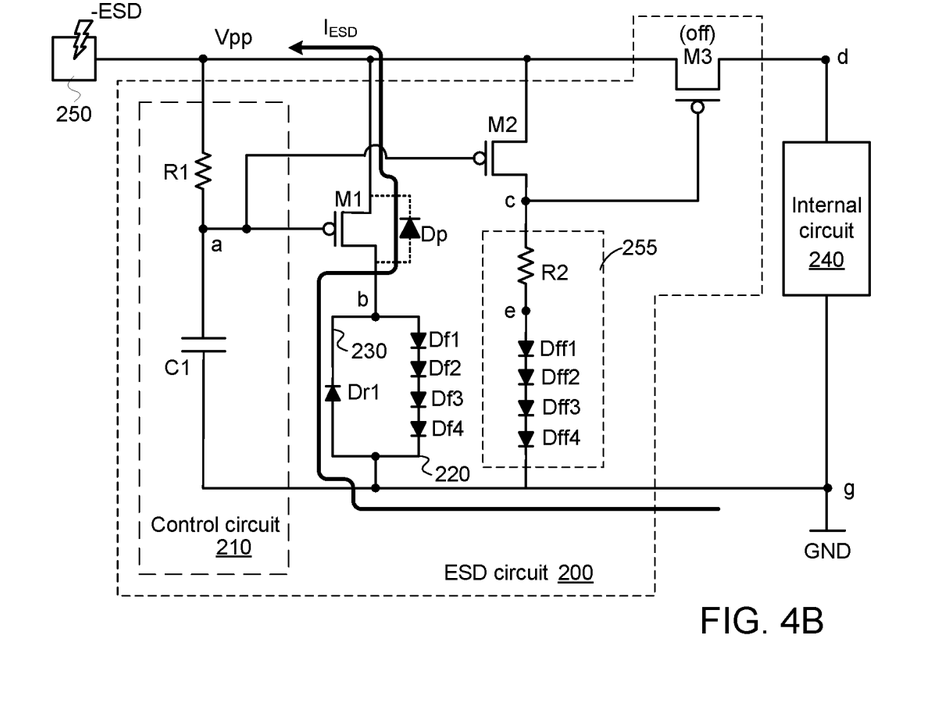
FIG. 4B is a schematic circuit diagram illustrating the ESD circuit of the second embodiment when a negative ESD zap is received.

FIG. 4B is a schematic circuit diagram illustrating the ESD circuit of the second embodiment when a negative ESD zap is received. When internal circuit is not powered and the negative ESD zap is received by the pad 250, the first supply voltage Vpp is decreased sharply, and the negative ESD current path is turned on. As a result, the ESD current $I_{ESD}$ flows from the node g to the pad 250 through the second ESD current path 230, the second source/drain terminal of the first P-type transistor M1, the parasitic diode Dp of the first P-type transistor M1 and the first source/drain terminal of the first P-type transistor M1.

Figure 4C:
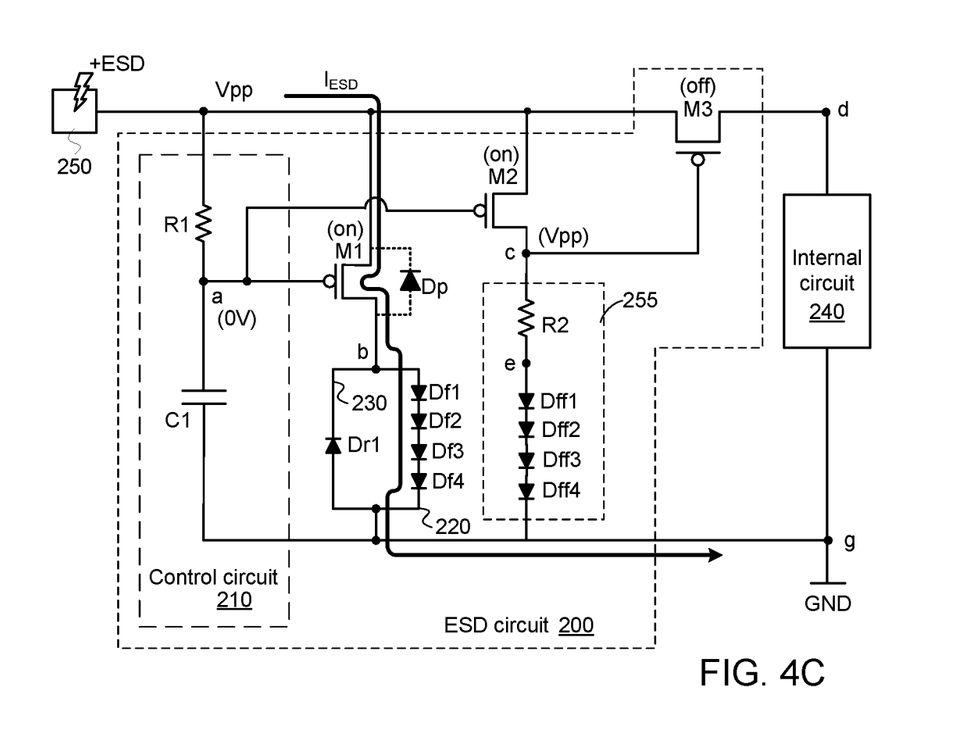
FIG. 4C is a schematic circuit diagram illustrating the ESD circuit of the second embodiment when a positive ESD zap is received.

FIG. 4C is a schematic circuit diagram illustrating the ESD circuit of the second embodiment when a positive ESD zap is received. When the internal circuit 240 is not powered and the positive ESD zap is received by the pad 250, the first supply voltage Vpp is increased rapidly and the first capacitor C1 temporarily acts as a short circuit to pull down the voltage at the node a to 0V. That is, a control voltage generated by the control circuit 210 at the node a is 0V so that the first P-type transistor M1 and the second P-type transistor M2 are turned on. During a turn-on period of the first P-type transistor M1 and the second P-type transistor M2, and the positive ESD current path is turned on to conduct a ESD current $I_{ESD}$. As shown in FIG. 4C, the ESD current $I_{ESD}$ flows from the pad 250 to the node g through the first source/drain terminal of the first P-type transistor M1, the channel region of the first P-type transistor M1, the second source/drain terminal of the first P-type transistor M1 and the first ESD current path 220. Moreover, since the second P-type transistor M2 is turned on, the first supply voltage Vpp is also transmitted to the node c to turn off the third P-type transistor M3 to isolate the node d from the pad 250, thereby protecting the internal circuit 240 from damaged by the ESD current $I_{ESD}$.

According to the embodiment of the present invention, the turn-on period of the first P-type transistor M1 and the second P-type transistor M2 is determined by the time constant T in the control circuit 210. During the turn-on period, the first capacitor C1 in the control circuit 210 starts charging form 0V. That is to say, the first capacitor C1 is charged according to the voltage at the pad 250 to pull up the voltage at the node a during the turn-on period.

At the end of the turn-on period, the voltage at the node a is charged to the higher voltage level by the first capacitor C1 in the control circuit 210. As a result, the first P-type transistor M1 and the second P-type transistor M2 are turned off and the third P-type transistor M3 is turned on. That is to say, the time constant T in the control circuit 210 should be properly designed to ensure that the ESD current $I_{ESD}$ can be completely discharged before the first P-type transistor M1 and the second P-type transistor M2 are turned off.

Figure 5:
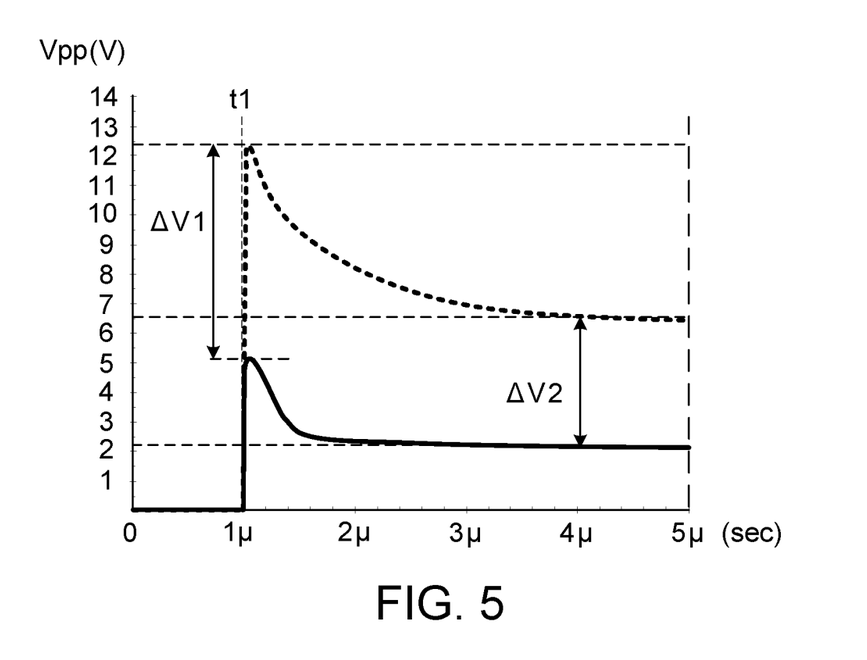
FIG. 5 is a plot illustrating the relationship between the voltage and the zapping time of the ESD circuit according to the second embodiment of the present invention when the HBM test is performed.

FIG. 5 is a plot illustrating the relationship between the voltage and the zapping time of the ESD circuit according to the second embodiment of the present invention when the HBM test is performed. Take a human body mode (HBM) test for example. When an electrostatic voltage of 2 KV is applied to the pad 250, the first supply voltage Vpp is increased to 5V. Consequently, the positive ESD current path is turned on, and the ESD current is transferred to the node g through the positive ESD current path. The dotted curve indicates that the first supply voltage Vpp is increased to 12.5V by the ESD circuit 100 of the first embodiment. The solid curve indicates first supply voltage Vpp is only increased to 5 by the ESD circuit 200 of this embodiment. The difference ΔV1 between the two curves is about 7.5V.

Please refer to FIG. 5 again. At the time point t1, the electrostatic voltage of 2 KV is received by the pad 250. The first supply voltage Vpp is increased to 5V in a very short time. Consequently, the positive ESD current path is turned on.

Since the positive ESD current path is turned on, the first supply voltage Vpp is decreased to the voltage level lower than 2.5V within 1 μs by the ESD circuit 200. The dotted curve indicates that the first supply voltage Vpp is decreased to a voltage level lower than 6.5V by the ESD circuit 100 of the first embodiment after the ESD zapping effect is eliminated. The solid curve indicates that first supply voltage Vpp is maintained at a voltage level near 2.2V by the ESD circuit 200 of this embodiment after the ESD zapping effect is eliminated. The difference ΔV2 between the two curves is about 4.3V. Since the first supply voltage Vpp is maintained at the voltage level near 2.2V, the semiconductor device in the internal circuit 240 is not influenced. In other words, the discharge performance of the ESD circuit of this embodiment is enhanced.

In the ESD circuit 200 of the second embodiment, the diodes Dff1~Dffz of the biasing circuit 255 are used to provide the bias voltage to the node c. In other words, the ESD current $I_{ESD}$ does not flow through these diodes Dff1~Dffz. Under this circumstance, the diodes Dff1~Dffz having smaller sizes are suitably applied to the biasing circuit 255.

Moreover, in the ESD circuit 200, the first P-type transistor M1 and the first ESD current path 220 are connected between the first supply voltage Vpp and the second supply voltage GND. The first P-type transistor M1 cooperates with the control circuit 210 to detect the ESD zap from the pad 250. Consequently, the ESD circuit 200 can effectively protect the internal circuit 240.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An electrostatic discharge (ESD) circuit connected with a pad and an internal circuit, the ESD circuit comprising:
   a control circuit, wherein the control circuit is connected between the pad and a first node;
   a first P-type transistor, wherein a first source/drain terminal of the first P-type transistor is connected with the pad, a gate terminal of the first P-type transistor is connected with the control circuit, and a second source/drain terminal of the first P-type transistor is connected with a second node;
   a first ESD current path, wherein the first ESD current path is connected between the second node and the first node;
   a second ESD current path, wherein the second ESD current path is connected between the second node and the first node;
   a second P-type transistor, wherein a first source/drain terminal of the second P-type transistor is connected with the pad, a gate terminal of the second P-type transistor is connected with the control circuit, and a second source/drain terminal of the second P-type transistor is connected with a third node;
   a biasing circuit, wherein the biasing circuit is connected between the third node and the first node; and
   a third P-type transistor, wherein a first source/drain terminal of the third P-type transistor is connected with the pad, a gate terminal of the third P-type transistor is connected with the third node, and a second source/drain terminal of the third P-type transistor is connected with a fourth node;
   wherein the internal circuit is connected between the fourth node and the first node;
   wherein in a normal working state, the first P-type transistor and the second P-type transistor are turned off, the third P-type transistor is turned on, and a first supply voltage received by the pad is transmitted to the fourth node and the internal circuit through the third P-type transistor;
   wherein when the pad receives a positive ESD zap, the control circuit provides a control voltage to turn on the first P-type transistor and the second P-type transistor, the third P-type transistor is turned off to isolate the internal circuit from the pad, and an ESD current flows from the pad to the first node through the first source/drain terminal of the first P-type transistor, a channel region of the first P-type transistor, the second source/drain terminal of the first P-type transistor and the first ESD current path.

2. The ESD circuit as claimed in claim 1, wherein the control circuit comprises:
a first resistor, wherein a first terminal of the first resistor is connected with the pad, and a second terminal of the first resistor is connected with a fifth node; and
a first capacitor, wherein a first terminal of the first capacitor is connected with the fifth node, and a second terminal of the first capacitor is connected with the first node;
wherein the gate terminal of the first P-type transistor is connected with the fifth node, and the gate terminal of the second P-type transistor is connected with the fifth node.

3. The ESD circuit as claimed in claim 2, wherein in the normal working state of the ESD circuit, the first capacitor is charged to pull up a voltage at the fifth node a to provide a control voltage to turn off the first P-type transistor and the second P-type transistor.

4. The ESD circuit as claimed in claim 2, wherein when the pad receives a positive ESD zap, the first capacitor acts as a short circuit to pull down a voltage at the fifth node to turn on the first P-type transistor and the second P-type transistor.

5. The ESD circuit as claimed in claim 4, wherein during a turn-on period of the first P-type transistor and the second P-type transistor, the first capacitor is charged according to a voltage at the pad to pull up the voltage at the fifth node and an ESD current flows from the pad to the first node through the first source/drain terminal of the first P-type transistor, a channel region of the first P-type transistor M1, the second source/drain terminal of the first P-type transistor M1 and the first ESD current path.

6. The ESD circuit as claimed in claim 5, wherein at the end of the turn-on period, the first capacitor is charged to a voltage level to turn off the first P-type transistor and the second P-type transistor.

7. The ESD circuit as claimed in claim 2, wherein the biasing circuit includes:
a second resistor, wherein a first terminal of the second resistor is connected with the third node, and a second terminal of the first resistor is connected with a sixth node; and
z diodes, wherein an anode terminal of the first diode of the z diodes in the biasing circuit is connected with the sixth node, the cathode terminal of the last diode of the z diodes in the biasing circuit is connected with the first node, the anode terminal of any of the other diodes in the biasing circuit is connected with the cathode terminal of the previous diode, the cathode of any of the other diodes in the biasing circuit is connected with the anode terminal of the next diode, and z is the integer.

8. The ESD circuit as claimed in claim 7, wherein in the normal working state, the pad receives the first supply voltage and the first node receives a second supply voltage, and the biasing circuit provides a bias voltage lower than the first supply voltage to the third node to turn on the third P-type transistor.

9. The ESD circuit as claimed in claim 7, wherein a first resistance of the first resistor is larger than a second resistance of the second resistor.

10. The ESD circuit as claimed in claim 1, wherein the first ESD current path includes x diodes, an anode terminal of the first diode of the x diodes in the first ESD current path is connected with the second node, a cathode terminal of the last diode of the x diodes in the first ESD current path is connected with the first node, the anode terminal of any of the other diodes in the first ESD current path is connected with the cathode terminal of the previous diode, the cathode of any of the other diodes in the first ESD current path is connected with the anode terminal of the next diode, and x is an integer.

11. The ESD circuit as claimed in claim 10, wherein the second ESD current path includes y diodes, the anode terminal of the first diode of the y diodes in the second ESD current path is connected with the first node, the cathode terminal of the last diode of the y diodes in the second ESD current path is connected with the second node, the anode terminal of any of the other diodes in the second ESD current path is connected with the cathode terminal of the previous diode, the cathode of any of the other diodes in the second ESD current path is connected with the anode terminal of the next diode, y is the integer, and x is greater than y.

12. The ESD circuit as claimed in claim 10, wherein the second ESD current path includes a diode, the anode terminal of the diode in the second ESD current path is connected with the first node, and the cathode terminal of the diode in the second ESD current path is connected with the second node.

13. The ESD circuit as claimed in claim 1, wherein when the pad receives a negative ESD zap, an ESD current flows from the first node to the pad through the second ESD current path, the second source/drain terminal of the first P-type transistor, a parasitic diode of the first P-type transistor and the first source/drain terminal of the first P-type transistor.

* * * * *